United States Patent
Iorga et al.

(10) Patent No.: US 9,571,077 B1
(45) Date of Patent: Feb. 14, 2017

(54) DYNAMIC UPDATE TECHNIQUE FOR PHASE INTERPOLATOR DEVICE AND METHOD THEREFOR

(71) Applicant: Rambus Inc., Sunnyvale, CA (US)

(72) Inventors: Cosmin Iorga, Newbury Park, CA (US); James L. Gorecki, Hillsboro, OR (US)

(73) Assignee: RAMBUS INC., Sunnyvale, CA (US)

( * ) Notice: Subject to any disclaimer, the term of this patent is extended or adjusted under 35 U.S.C. 154(b) by 0 days.

(21) Appl. No.: 14/798,340

(22) Filed: Jul. 13, 2015

(51) Int. Cl.
| | |
|---|---|
| *H03H 11/16* | (2006.01) |
| *H03K 5/13* | (2014.01) |
| *H03K 5/135* | (2006.01) |
| *H03L 7/189* | (2006.01) |
| *H03L 7/191* | (2006.01) |

(52) U.S. Cl.
CPC ............ *H03K 5/131* (2013.01); *H03K 5/135* (2013.01); *H03L 7/189* (2013.01); *H03L 7/191* (2013.01)

(58) Field of Classification Search
None
See application file for complete search history.

(56) References Cited

U.S. PATENT DOCUMENTS

| | | | | |
|---|---|---|---|---|
| 8,995,600 | B1 * | 3/2015 | Gopalakrishnan | .... H04L 7/0331 375/376 |
| 9,160,345 | B1 * | 10/2015 | Gorecki | ................ H03K 5/135 |

\* cited by examiner

*Primary Examiner* — Cassandra Cox
(74) *Attorney, Agent, or Firm* — Lowenstein Sandler LLP (57) ABSTRACT

A method and device for dynamically updating a phase interpolator circuit module using a phase update circuit module. The method can include interpolating a set of input clock phases based on a phase interpolator code input and sequentially updating the rising edge generator and falling edge generator starting from a synchronizer update signal. The dynamic sequential update involves disabling a rising edge ramp signal while updating a rising edge interpolator and generating old clock out falling edge according to an old phase interpolator code input, disabling a falling edge ramp signal while updating a falling edge interpolator, enabling the rising edge ramp signal and generating a new clock out rising edge according to a new phase interpolator code input, and enabling the falling edge ramp signal and generating a new clock out falling edge according to the new phase interpolator code input.

20 Claims, 9 Drawing Sheets

DYNAMIC UPDATE TECHNIQUE FOR PHASE INTERPOLATOR DEVICE AND METHOD THEREFOR

CROSS-REFERENCES TO RELATED APPLICATIONS

N/A

BACKGROUND OF THE INVENTION

The present invention relates to communication systems, memory systems, and integrated circuit (IC) devices.

Over the last few decades, the use of communication networks has exploded. In the early days of the Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily. With such high demands on data and data transfer, existing data communication systems need to be improved to address these needs.

CMOS technology is commonly used to design communication and memory systems. As CMOS technology is scaled down to make circuits and systems run at higher speed and occupy smaller chip (die) area, the operating supply voltage is reduced for lower power. An important factor in device operations is the phase interpolation of clock signals to maintain synchronization of various electronic devices in communication systems. Failure to adjust clock signals without glitches can render systems non-functional. Conventional techniques for updating the phase interpolation of a communications system take too long or are prone to glitching. Limitations such as these provide significant challenges to the continued improvement of communication systems scaling and performance.

Accordingly, improvements to update techniques for phase interpolation in integrated circuit devices are highly desirable.

BRIEF SUMMARY OF THE INVENTION

The present invention relates to communication systems, memory systems, and integrated circuit (IC) devices. More particularly, the present invention provides several methods and circuit devices for dynamically updating a phase interpolator circuit module.

In various embodiments, the method can include updating the phase of the phase interpolator circuit module in less than 2.5 clock cycles without any short pulse glitch. In a specific embodiment, the method provides a phase update circuit that performs a technique involving updating sequentially first the rising edge then the falling edge with the decision of inserting an artificial falling edge while temporarily disabling the rising and falling edge generators. This phase update circuit and phase interpolator circuit module can be implemented in a data communication system, data buffer circuit device, or the like.

In an embodiment, the present invention provides a method and device for dynamically updating a phase interpolator circuit module using a phase update circuit module. The method can include interpolating a set of input clock phases based on a phase interpolator code input and sequentially updating the rising edge generator and falling edge generator starting from a synchronizer update signal. The dynamic sequential update involves disabling a rising edge ramp signal while updating a rising edge interpolator and generating old clock out falling edge according to an old phase interpolator code input, disabling a falling edge ramp signal while updating a falling edge interpolator, enabling the rising edge ramp signal and generating a new clock out rising edge according to a new phase interpolator code input, and enabling the falling edge ramp signal and generating a new clock out falling edge according to the new phase interpolator code input.

Many benefits are recognized through various embodiments of the present invention. Such benefits include a quick and efficient technique for updating a phase interpolator circuit module substantially free from signal glitches than can render the device non-functional. Other benefits will be recognized by those of ordinary skill in the art that the mechanisms described can be applied to other IC systems as well.

DETAILED DESCRIPTION OF THE INVENTION

The present invention relates to communication systems, memory systems, and integrated circuit (IC) devices. More particularly, the present invention provides The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

In various embodiments, the present invention provides several methods and circuit devices for dynamically updating a phase interpolator circuit module. The method can include updating the phase of the phase interpolator circuit module in less than 2.5 clock cycles without any short pulse glitch. In a specific embodiment, the present invention provides a phase update circuit that performs a technique involving updating sequentially first the rising edge then the falling edge with the decision of inserting an artificial falling edge while temporarily disabling the rising and falling edge generators. Further details of the various embodiments are further described below.

Figures 1A, 1B, 1C:
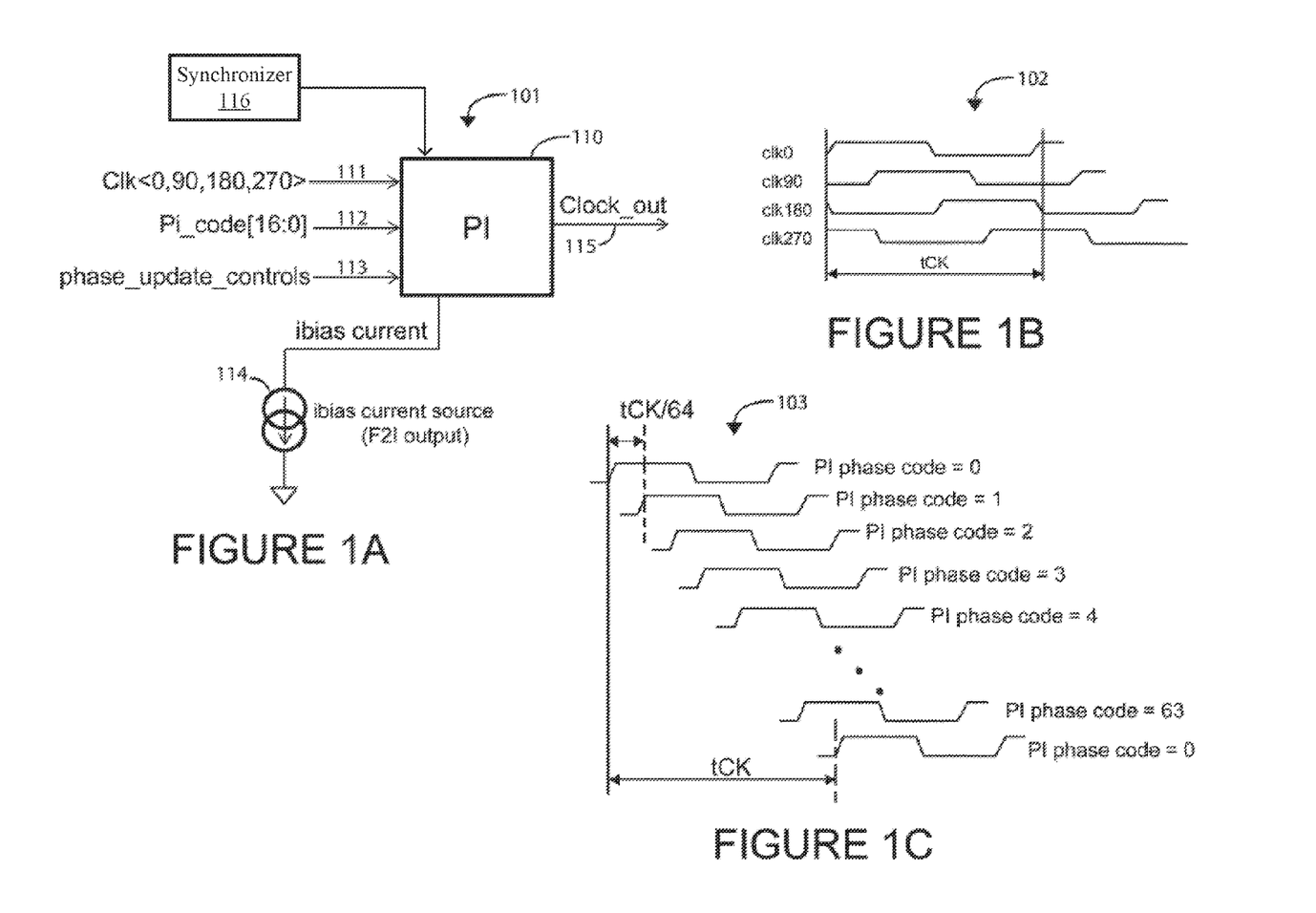
FIG. 1A is a simplified block diagram of a phase interpolator circuit module according to an embodiment of the present invention.
FIG. 1B is a simplified timing diagram of a set of input clock signals of the phase interpolator circuit module of FIG. 1A.
FIG. 1C is a simplified timing diagram of set of output clock signals of the phase interpolator circuit module of FIG. 1A.

FIG. 1A is a simplified block diagram of a phase interpolator circuit module 101 according to an embodiment of the present invention. As shown, circuit block 110 represents a phase interpolator circuit module, which can be used in a communications circuit system or a data buffer circuit system for changing clock signal phases. This block 101 receives four input clock phases 111 that are nominally spaced apart by 90 degrees (CLK<0, 90, 180, 270>). These input clock phases can be provided from a global clock distribution network. This block 101 also takes a phase interpolator (PI) code 112 and a phase update control signal 113 as inputs and is coupled to a current source 114. The phase interpolator circuit block 101 outputs an output clock signal 115

FIG. 1B is a simplified timing diagram 102 of a set of input clock signals of the phase interpolator circuit module of FIG. 1A. This timing diagram 102 shows the four nominally spaced clock phases described previously (CLK<0, 90, 180, 270>). As shown, these clock phases are spaced apart by 90 degrees from. The length of a single clock phase is marked by tCK on the diagram across all four represented clock phases.

FIG. 1C is a simplified timing diagram 103 of set of output clock signals of the phase interpolator circuit module of FIG. 1A. In an embodiment, the phase interpolator circuit module (101 of FIG. 1A) can produce one of 64 possible output phases based on the PI control code [16:0] (112 of FIG. 1A). Timing diagram 103 shows the various output phases depending on the value of the PI_code[16:0], showing the range from 0 to 63. Both the length of a single clock phase (tCK) and the length of the phase shift (tCK/64) between each output are shown in the diagram.

In a specific embodiment, the PI interpolates two of the four global quadrature clock phases according to the 17-bit mixed code phase control setting on the PI_code[16:0] pins shown in FIG. 1A. As an example, a phase setting of zero interpolates 100% of the "0 degree" global clock phase (CLK 0). Non-zero phase settings interpolate differently in order to produce an output that delayed by 1 to 63 phase steps, with a nominal phase step size of tCK/64, from the "0 degree" global clock phase depending on the PI code.

In a specific embodiment, the PI code is a thermal phase code that inverts the signal when it crosses a phase quadrant boundary. This process allows any single-step phase change, even those crossing a quadrant boundary, to occur without glitching the clock or causing a glitch in the clock signal. Any such phase change either changes the interpolator weighting or changes the zero-weighted quadrature phase, which is shown in the phase encoding table (FIG. 1C).

Figure 2:
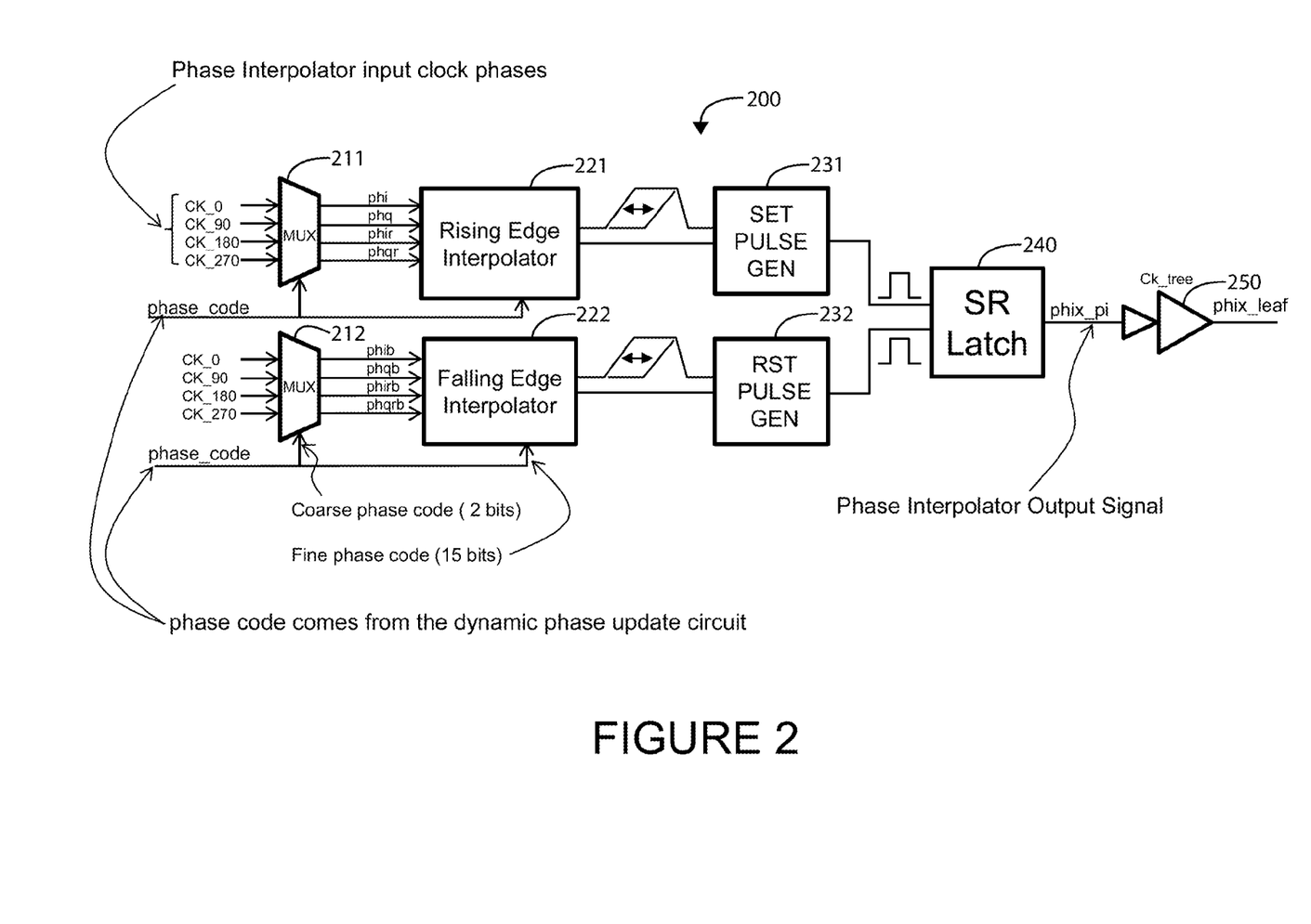
FIG. 2 is a simplified block diagram of a phase interpolator circuit module according to an embodiment of the present invention.

FIG. 2 is a simplified block diagram of a phase interpolator circuit module 200 according to an embodiment of the present invention. This module 200 can provide a more detailed embodiment of circuit block 101 as shown previously in FIG. 1A. As shown, the module 200 includes a rising edge multiplexer 211 coupled to a rising edge interpolator 221 and a falling edge multiplexer 212 coupled to a falling edge interpolator 222. The phase interpolator input clock phases (CLK<0, 90, 180, 270>) are coupled to both the rising and falling edge multiplexers 211, 212. Each of the interpolators 221, 222 are coupled to a pulse generator. The rising edge interpolator 221 is coupled to the set pulse generator 231, while the falling edge interpolator 222 is coupled to the reset pulse generator 232. Both of these pulse generators 231, 232 are coupled to an SR latch 240, which provides the phase interpolator output signal. The output signal can be fed into an amplifier 250.

In an embodiment, each of these multiplexers 211, 212 takes the phase code input, which can be the 17-bit mixed code described previously. In a specific embodiment, this phase code can include a coarse phase code and a fine phase code. As noted on the diagram, the coarse phase code consists of 2 bits and the fine phase code consists of 15 bits. The phase code signal can be provided by a phase update circuit module, which is configured to perform a dynamic update without causing a glitch in the output clock signal.

Figure 3A:
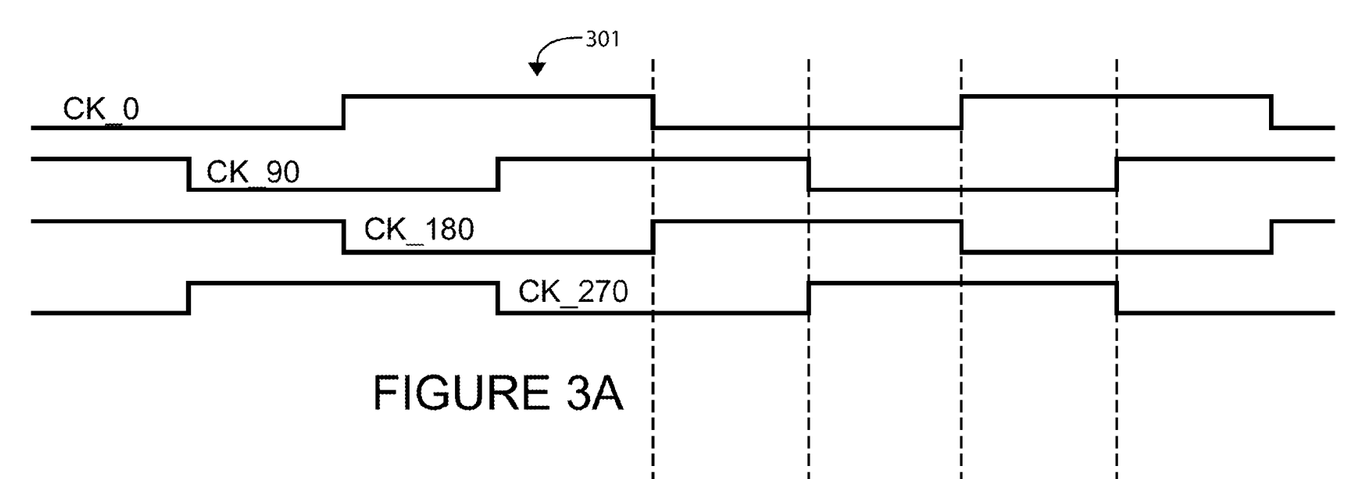
FIGS. 3A and 3B are simplified timing diagrams illustrating the interaction of the input clock signals (FIG. 3A) with the output clock signals (FIG. 3B) according to an embodiment of the present invention.
Figure 3B:
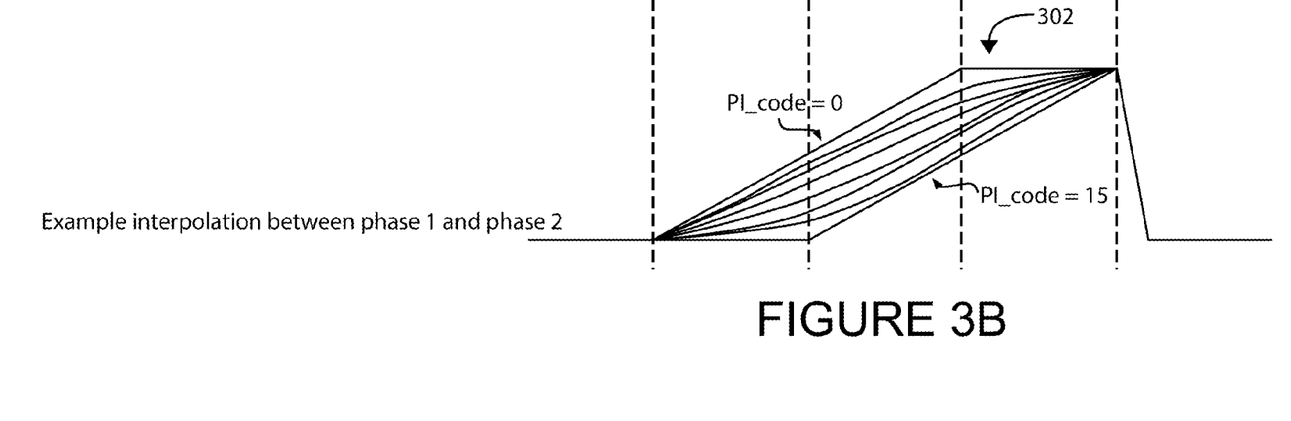

FIGS. 3A and 3B are simplified timing diagrams illustrating the interaction of the input clock signals (FIG. 3A) with the output clock signals (FIG. 3B) according to an embodiment of the present invention. As shown, timing diagram 301 is a similar diagram to FIG. 1B, which shows the four global clock phases. Timing diagram 302 shows various interpolations of the global clock signals based on the PI code provided from the phase update circuit module. As an example, this diagram 302 shows the interpolation between phase 1 and phase 2 signals to provide the various phase steps based on PI codes 0 through 15.

Figure 4:
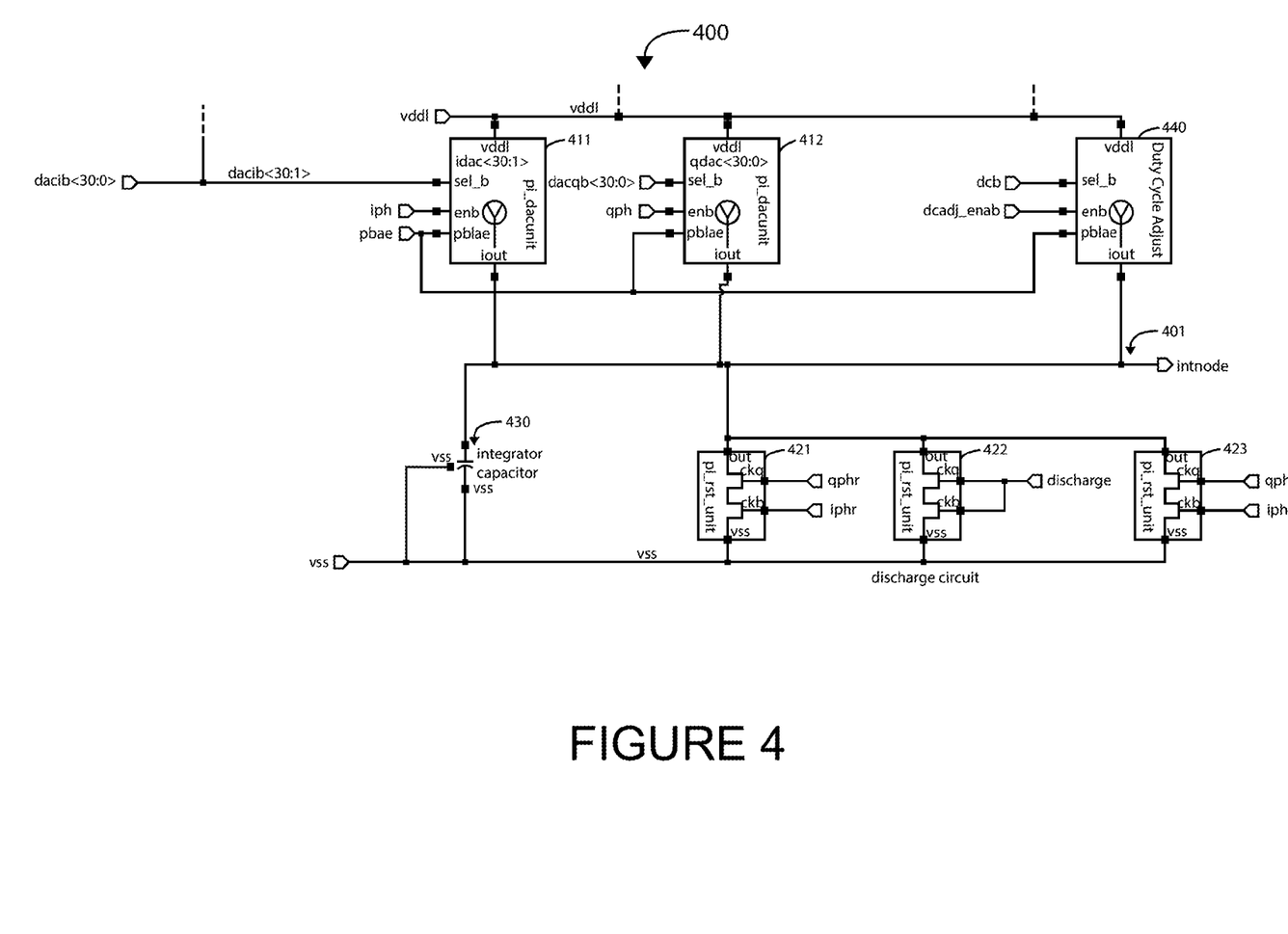
FIG. 4 is a simplified circuit block diagram of a phase interpolator circuit module according to an embodiment of the present invention.

FIG. 4 is a simplified circuit block diagram of a phase interpolator circuit module according to an embodiment of the present invention. More specifically, circuit diagram 400 can represent an embodiment of the each of phase interpolators 221, 222 described previously for FIG. 2. As shown, the phase interpolator can include a first plurality of digital-to-analog converters (DACs) 411 and a second plurality of DACs 412. As an example, FIG. 4 shows the first plurality of DACs 411 as an array of DACs <30:1>, while the second plurality of DACs 412 is shown as an array of DACs <30:0>. There can be other variations, modifications, and alternatives. Each of these pluralities or arrays of DACs 411, 412 include the inputs as previously shown in FIG. 2, along with a connection to a vdd source. These pluralities of DACs 411, 412 can be current source DACs, or the like.

In an embodiment, the phase interpolator 400 can include an integrator node 401 that is coupled an output of each of the pluralities of DACs. This integrator node is also coupled to an integrator capacitor 430 and several discharge units 421, 422, and 423. These discharge circuits can be related to the set and reset pulse generators described in FIG. 2. In a specific embodiment, the course phase code described previously can feed into the multiplexer, while the fine phase code can feed into the interpolator. Also, the interpolator 400 can include a duty cycle adjust module 440, which is also coupled to the vdd source and has an output coupled to the integrator node 401. This adjust module 440 can be a shift module, providing offsets functions depending upon application.

Figure 5:
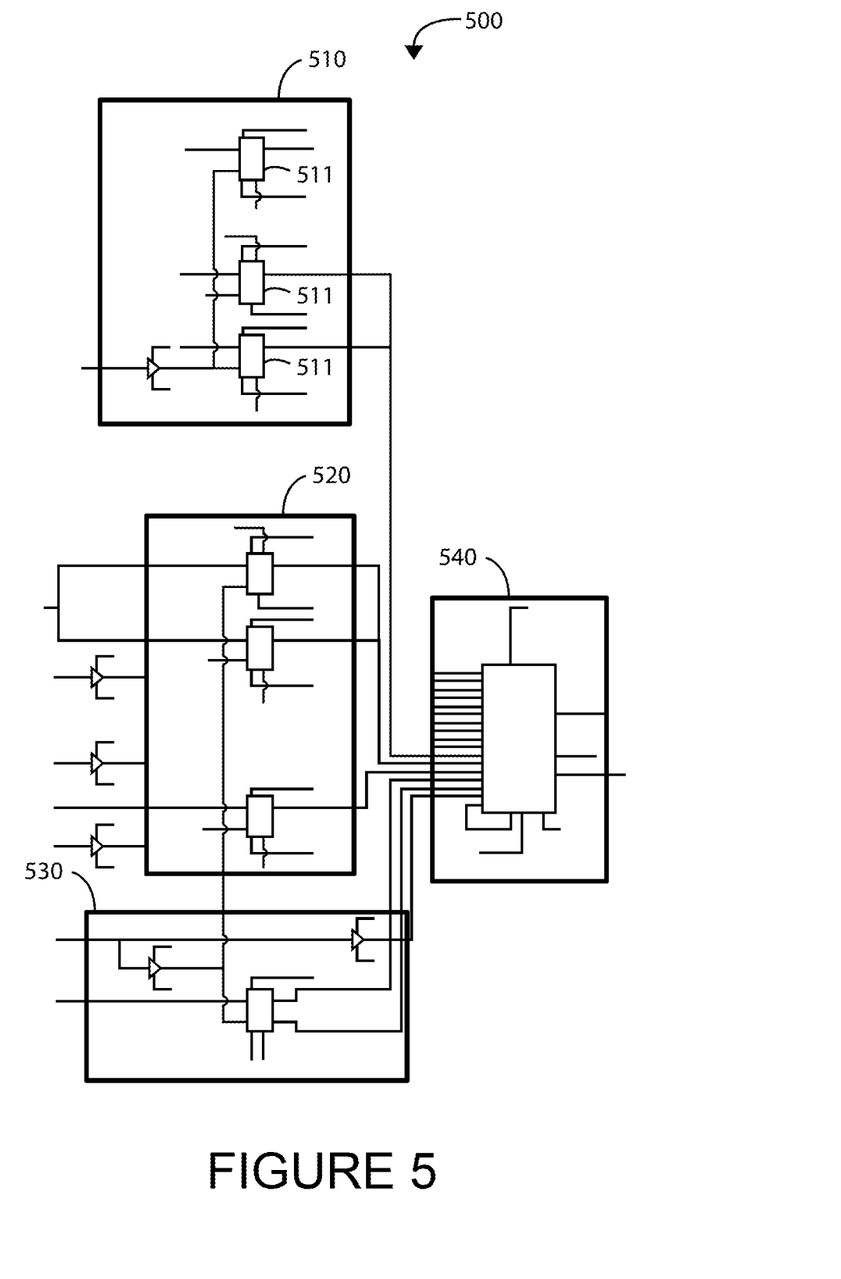
FIG. 5 is a simplified circuit block diagram of a dynamic phase update circuit module according to an embodiment of the present invention.

FIG. 5 is a simplified circuit block diagram of a dynamic phase update circuit module according to an embodiment of the present invention. As shown, the dynamic phase update circuit module 500 can include a falling edge update circuit 510, a rising edge update circuit 520, and a fine interpolator code update circuit 530. As an example, the falling edge update circuit 510 can include a plurality of digital flip flops 511. The rising edge update circuit can include the same. These circuits can be coupled to an analog path/phase update circuit 540, which are described in more detail in FIG. 6.

Figure 6:
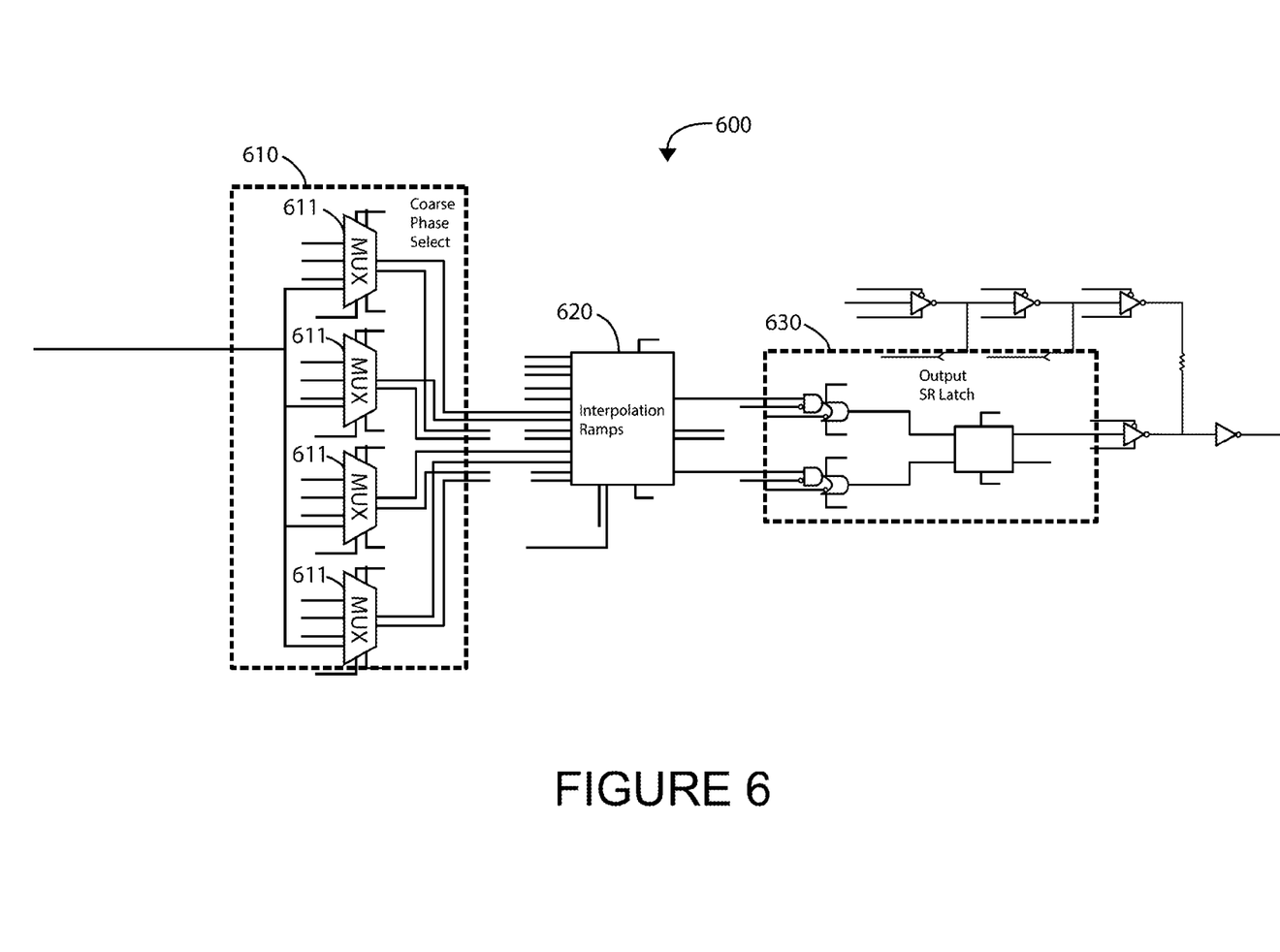
FIG. 6 is a simplified circuit block diagram of a phase interpolator analog path circuit module.

FIG. 6 is a simplified circuit block diagram of a phase interpolator analog path circuit module. This module can represent a portion of the circuit 540 shown previously in FIG. 5. As shown, this analog path circuit module 600 can include a coarse phase select module 610 coupled to interpolation ramps 620, which are coupled to an output SR latch 630. The coarse phase select module 610 can include a plurality of multiplexers 611, which facilitate the decoding the coarse phase select bits. The interpolation ramps 620 can include integrators for rising and falling edges.

Figure 7:
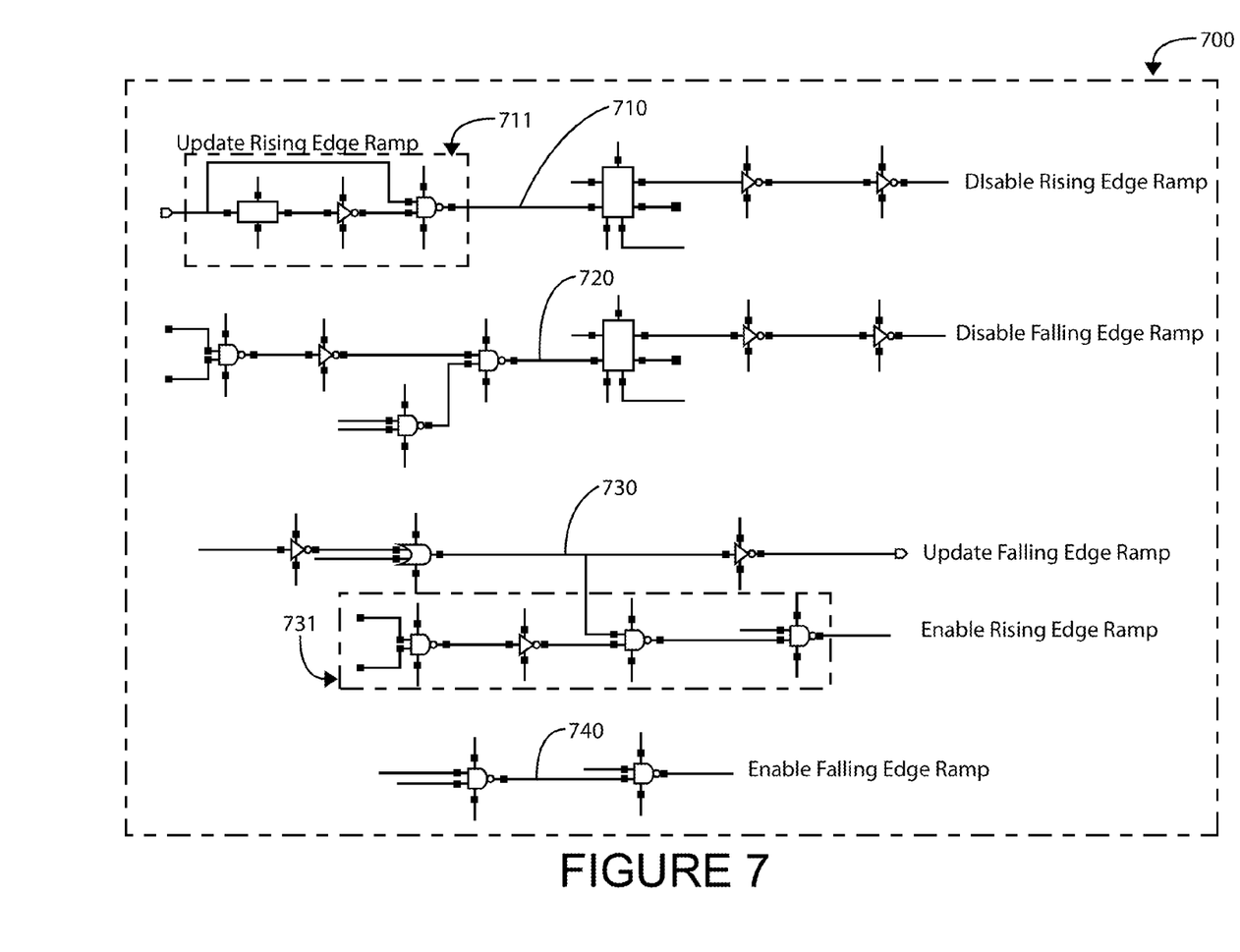
FIG. 7 is a simplified circuit block diagram of a phase update circuit module according to an embodiment of the present invention.

FIG. 7 is a simplified circuit block diagram of a phase update circuit module according to an embodiment of the present invention. This module can represent a portion of the circuit 540 shown previously in FIG. 5. As shown, phase update circuit module 700 can include several circuits that are critical for the update algorithm used with the phase interpolator module. A disable rising edge ramp circuit 710 is shown with an update rising edge ramp circuit 711 coupled in front. Underneath circuit 710 is the disable falling edge ramps circuit 720. The update falling edge ramp circuit 730 is also coupled to an enable rising edge ramp circuit 731.

Figure 8:
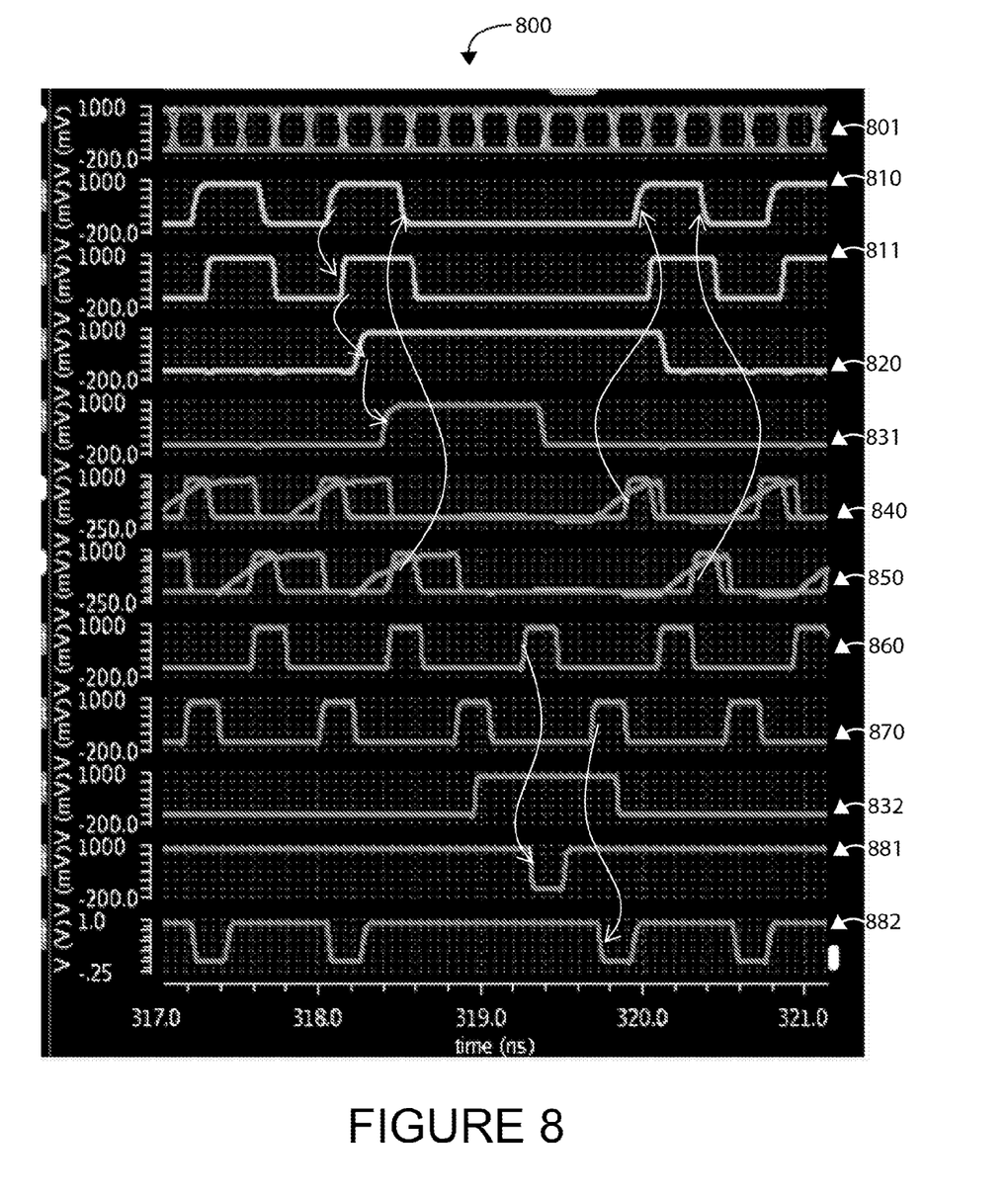
FIG. 8 is a simplified timing diagram illustrating a method for dynamically updating a phase interpolator circuit module according to an embodiment of the present invention.

FIG. 8 is a simplified timing diagram illustrating a method for dynamically updating a phase interpolator circuit module according to an embodiment of the present invention. This timing diagram 800 shows an example of the interactions of signals in an update algorithm for a phase interpolator by a phase update circuit. The top signal 801 shows the overlapping signals of the four global clock phases CLK<0, 90, 180, and 270> as described in FIGS. 1B and 3A. The second and third signals 810 and 811 are the resulting clock output signals of the update algorithm. Signal 810 is directly after the SR latch 240 as shown in FIG. 2, while signal 811 is after the amplifier 250, denoted as Ck tree, as shown in FIG. 2. In this figure, the oscillation of clock signal 811 follows signal 810 with a slight delay. The remaining signals in the fields below represent an example of the update technique for the phase interpolator circuit module.

In an example, the method for dynamically updating the phase interpolator circuit module includes receiving an update pulse, shown in signal 820 from a synchronizer 116. Looking at the previous clock out signals, the update pulse follows the rising edge of the second pulse of clock out signal 811, which follows the rising edge of the second pulse of clock out signal 810. In this case, the update pulse of signal 820 follows the rising edge of the second clock pulse of signal 811. In this example, these clock out signals are generated by the periodic signals from the rising edge interpolator ramp signal and the falling edge interpolator ramp signal.

A first update pulse signal is generated in response to the synchronizer 116 update pulse (signal 820) from the synchronizer 116, as shown in signal 831. The pulse of the first update signal 831 blocks the rising edge interpolator ramp and updates only the rising edge with a new phase code. This means that the falling edge interpolator remains at an old phase code. Signal 840 represents the output of the rising edge interpolator ramp, which shows the periodic generation of the clock out rising edges. As shown, the rising edge ramp signal remains flat while the first update signal 831 remains high and resumes its periodic waveforms once the first update signal 831 goes low.

During the first update pulse, the clock out falling edge is generated on the old phase code. Signal 850 represents the output of the falling edge interpolator ramp, which shows the periodic generation of clock out falling edges. After the generation of the clock out falling edge within pulse of the first update signal, a second update pulse signal 832 is generated to update the falling edge interpolator codes. This second update pulse signal 832 blocks the falling edge interpolator ramp and activates the lookup for the next rising edge ramp reset signal.

When the next rising edge ramps reset signal 860 arrives, a first clear signal 881 deactivates the blocking of the rising edge ramp, which enables the first rising edge on the updated phase code. Signal 860 represents the rising edge ramp reset signal, which is a periodic signal. The pulse of signal 860 within the second update pulse signal 832 triggers the first clear signal, shown as an pulse low on signal 881 (i.e. the clear signal, normally being high, pulses low). The first clear signal 881 also activates the lookup for the next falling edge ramp reset signal.

When the next falling edge ramp reset signal 870 arrives, a second clear signal 882 deactivates the blocking of the falling edge ramp, which enables the first falling edge on the updated phase code. Signal 870 represents the falling edge ramp reset signal, which is also a periodic signal. The pulse of signal 870 during the second update pulse signal 832 triggers the second clear signal, shown as a pulse low on signal 882.

Following this step, the phase interpolator is updated to new phase codes on both the rising edge and falling edge interpolator ramps. This method provides a quick and effective technique for responding to changes in the phase control word (phase code) by producing a glitch-free output that has settled by the second rising edge of the output after the phase code change.

Figure 9:
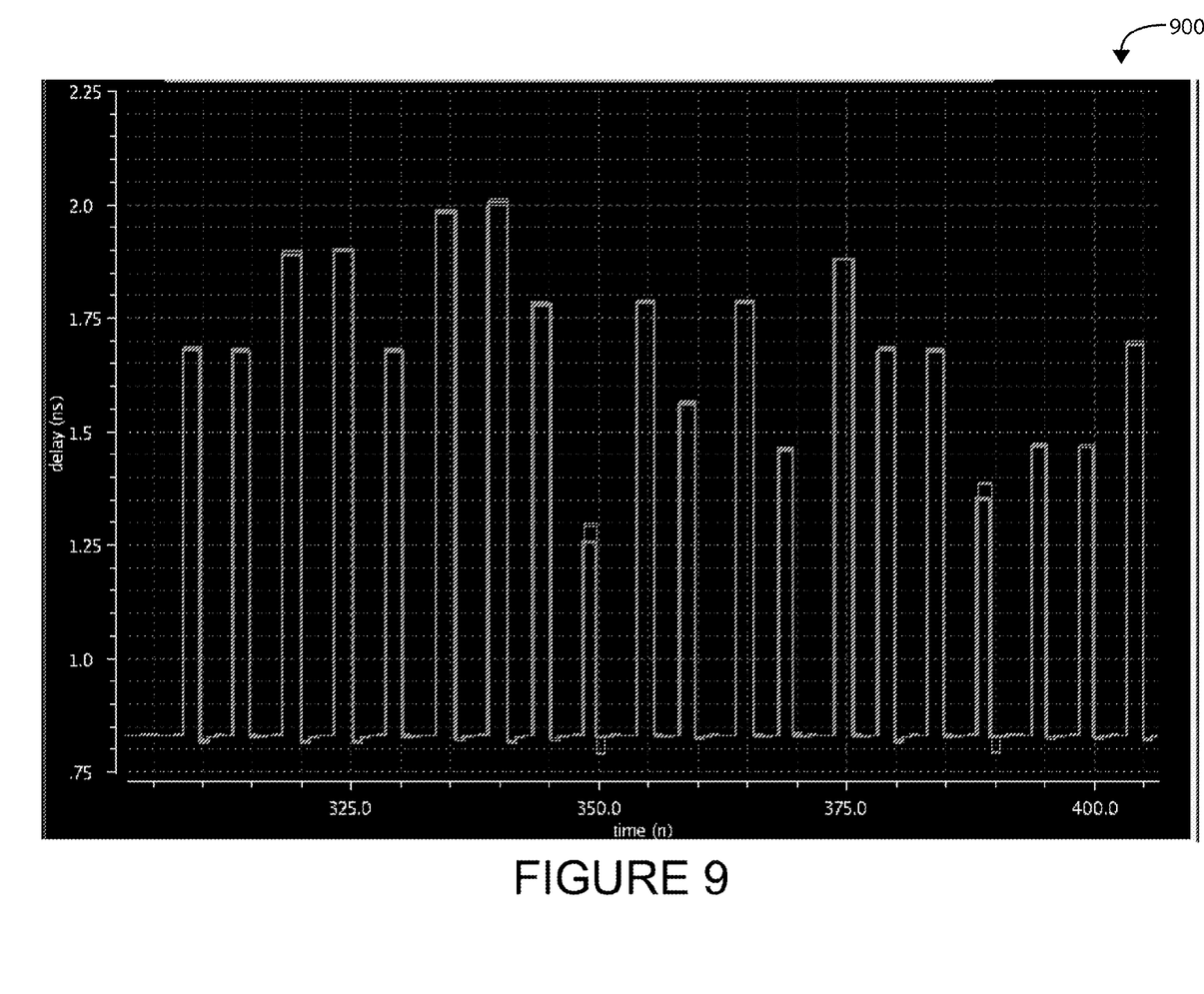
FIG. 9 is a simplified graph illustrating update times for a method for dynamically updating a phase interpolator circuit module according to an embodiment of the present invention.

FIG. 9 is a simplified graph 900 illustrating update times for a method for dynamically updating a phase interpolator circuit module according to an embodiment of the present invention. As shown, graph 900 shows update times (tCLK=833 ps) in a plot of delay (ns) over time (n). In an example, the update algorithm substantially eliminates intermediate clock pulses that occurred at some PVT conditions.

In an embodiment, the present invention provides method for dynamically updating a phase interpolator circuit module using a phase update circuit module coupled to the phase interpolator circuit module. The method can include:

- receiving, in the phase interpolator circuit module, a set of input clock phases including four input clock phases nominally spaced apart by 90 degrees;
- receiving, in the phase interpolator circuit module, a new phase interpolator code input;
- receiving, in the phase update circuit module, a synchronizer update signal;
- generating, in the phase update circuit module, a first update pulse signal, the first update pulse signal being configured to disable a rising edge ramp signal of the phase interpolator circuit module and to update a rising edge interpolator of the phase interpolator circuit module according to the phase interpolator code input;
- generating, in the phase interpolator circuit module, an old clock out falling edge according to an old phase interpolator code input and a falling edge ramp signal of the phase interpolator circuit module;
- generating, in the phase update circuit module, a second update pulse signal in response to the first update pulse signal and a rising edge ramp reset signal, the second update pulse signal being configured to disable the falling edge ramp signal of the phase interpolator circuit module and to update a falling edge interpolator of the phase interpolator circuit module according to the phase interpolator code input and to activate a lookup for a rising edge ramp reset signal;
- generating, in the phase update circuit module, a first clear signal in response to the rising edge ramp reset signal, the first clear signal being configured to enable the rising edge ramp signal and to activate a lookup for a falling edge ramp reset signal;
- generating, in the phase interpolator circuit module, a new clock out rising edge according to the new phase interpolator code input and the rising edge ramp signal;
- generating, in the phase update circuit module, a second clear signal in response to the falling edge ramp reset signal, the second clear signal being configured to enable the falling edge ramp signal;
- generating, in the phase interpolator circuit module, a new clock out falling edge according to the new phase interpolator code input and the falling edge ramp signal; and
- outputting, by the phase interpolator circuit module, an updated clock out signal according to the new clock out rising edge and new clock out falling edge according to the new phase interpolator code input.

The present invention can also include a phase interpolation update circuit device configured for dynamically updating a phase interpolator circuit module using a phase update circuit module. The device can be described as follows. The phase interpolator circuit module can include a rising edge multiplexer configured with a set of input clock phases including four input clock phases nominally spaced apart by 90 degrees and a phase interpolator code input, a rising edge interpolator coupled to the rising edge multiplexer and being configured to the phase interpolator code input, and a set pulse generator coupled to the rising edge interpolator. The interpolator module can also include a falling edge multiplexer configured with the set of input clock phases and the phase interpolator code input, a falling edge interpolator coupled to the falling edge multiplexer and being configured to the phase interpolator code input, and a reset pulse generator coupled to the falling edge interpolator. An SR latch can be coupled to the set pulse generator and the reset pulse generator.

In an embodiment, the update circuit device can include a synchronizer 116 coupled to the phase update circuit module, the synchronizer 116 being configured to provide a synchronizer 116 update signal. The phase update circuit module can include a phase code update circuit coupled to the phase interpolator circuit module and being configured to update a rising edge interpolator and a falling edge interpolator of the phase interpolator circuit module according to the phase interpolator code input.

The phase update circuit module can also include a rising edge update circuit coupled to the phase interpolator circuit module. This rising edge update circuit can be configured to generate a first update pulse signal to disable the rising edge ramp circuit of the phase interpolator circuit module, and generate a first clear signal in response to the rising edge ramp reset signal in order to enable the rising edge ramp signal and to activate a lookup for a falling edge ramp reset signal.

The update circuit module can also include a falling edge update circuit coupled to the phase interpolator circuit module. The falling edge update circuit can be configured to generate an old clock out falling edge according to an old phase interpolator code input and a falling edge ramp signal of the phase interpolator circuit module, and to generate a second update pulse signal in response to the first update pulse signal and a rising edge ramp reset signal in order to disable the falling edge ramp signal of the phase interpolator circuit module and to activate a lookup for a rising edge ramp reset signal, and generate a second clear signal in response to the falling edge ramp reset signal in order to enable the falling edge ramp signal.

In an example, the phase interpolator circuit module is configured to generate a new clock out rising edge according to the new phase interpolator code input and the rising edge ramp signal, generate a new clock out falling edge according to the new phase interpolator code input and the falling edge ramp signal, and output an updated clock out signal according to the new clock out rising edge and the new clock out falling edge according to the new phase interpolator code input. Those of ordinary skill in the art will recognize other variations, modifications, and alternatives.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method for dynamically updating a phase interpolator circuit module using a phase update circuit module coupled to the phase interpolator circuit module, the method comprising:

- receiving, in the phase interpolator circuit module, a set of input clock phases including four input clock phases nominally spaced apart by 90 degrees;

receiving, in the phase interpolator circuit module, a new phase interpolator code input;

receiving, in the phase update circuit module, a synchronizer update signal;

generating, in the phase update circuit module, a first update pulse signal, the first update pulse signal being configured to disable a rising edge ramp signal of the phase interpolator circuit module and to update a rising edge interpolator of the phase interpolator circuit module according to the phase interpolator code input;

generating, in the phase interpolator circuit module, an old clock out falling edge according to an old phase interpolator code input and a falling edge ramp signal of the phase interpolator circuit module;

generating, in the phase update circuit module, a second update pulse signal in response to the first update pulse signal and a rising edge ramp reset signal, the second update pulse signal being configured to disable the falling edge ramp signal of the phase interpolator circuit module and to update a falling edge interpolator of the phase interpolator circuit module according to the phase interpolator code input and to activate a lookup for a rising edge ramp reset signal;

generating, in the phase update circuit module, a first clear signal in response to the rising edge ramp reset signal, the first clear signal being configured to enable the rising edge ramp signal and to activate a lookup for a falling edge ramp reset signal;

generating, in the phase interpolator circuit module, a new clock out rising edge according to the new phase interpolator code input and the rising edge ramp signal;

generating, in the phase update circuit module, a second clear signal in response to the falling edge ramp reset signal, the second clear signal being configured to enable the falling edge ramp signal;

generating, in the phase interpolator circuit module, a new clock out falling edge according to the new phase interpolator code input and the falling edge ramp signal; and outputting, by the phase interpolator circuit module, an updated clock out signal according to the new clock out rising edge and new clock out falling edge according to the new phase interpolator code input.

2. The method of claim 1 wherein four input clock phases of the set of input clock phases consists of a 0 degree phase clock signal, a 90 degree phase clock signal, a 180 degree clock phase signal, and a 270 degree phase clock signal.

3. The method of claim 1 wherein the old phase interpolator code input and the new phase interpolator code input are 17-bit mixed code inputs, wherein the 17-bit mixed code input consists of a 15-bit fine phase code and a 2-bit coarse phase code.

4. The method of claim 3 wherein the 2-bit coarse phase code is provided to a multiplexer of the phase interpolator circuit module; the multiplexer being configured with the set of input clock phases.

5. The method of claim 3 wherein the 15-bit fine phase code is provided to each of a rising edge interpolator and a falling edge interpolator of the phase interpolator circuit module.

6. The method of claim 1 wherein the rising edge ramp signal is a periodic signal produced by a rising edge interpolator ramp circuit of the phase interpolator circuit module; and wherein the falling edge ramp signal is a periodic signal produced by a falling edge interpolator ramp circuit of the phase interpolator circuit module.

7. The method of claim 1 wherein each of the rising edge interpolator and the falling edge interpolator comprises a first plurality of digital-to-analog converters (DACs) and a second plurality of DACs;

wherein the rising edge ramp signal is determined by a ratio of activated DACs of the first plurality of DACs to the second plurality of DACs in the rising edge interpolator; and wherein the falling edge ramp signal are determined by a ratio of activated DACs of the first plurality of DACs to the second plurality of DACs in the falling edge interpolator.

8. The method of claim 1 wherein the outputting of the updated clock out signal according to the new phase interpolator code input is substantially free from signal glitches due to sequence of generated signals from the phase update circuit module.

9. A phase interpolation update circuit device configured for dynamically updating a phase interpolator circuit module using a phase update circuit module, the device comprising:

the phase interpolator circuit module comprising:
  a rising edge multiplexer configured with a set of input clock phases including four input clock phases nominally spaced apart by 90 degrees and a phase interpolator code input,
  a rising edge interpolator coupled to the rising edge multiplexer and being configured to the phase interpolator code input,
  a set pulse generator coupled to the rising edge interpolator,
  a falling edge multiplexer configured with the set of input clock phases and the phase interpolator code input,
  a falling edge interpolator coupled to the falling edge multiplexer and being configured to the phase interpolator code input,
  a reset pulse generator coupled to the falling edge interpolator, and
  an SR latch coupled to the set pulse generator and the reset pulse generator;

a synchronizer coupled to the phase update circuit module, the synchronizer being configured to provide a synchronizer update signal;

the phase update circuit module comprising:
  a phase code update circuit coupled to the phase interpolator circuit module and being configured to update a rising edge interpolator and a falling edge interpolator of the phase interpolator circuit module according to the phase interpolator code input,
  a rising edge update circuit coupled to the phase interpolator circuit module and being configured to:
    generate a first update pulse signal to disable a rising edge ramp circuit of the phase interpolator circuit module, and
    generate a first clear signal in response to a rising edge ramp reset signal in order to enable the rising edge ramp signal and to activate a lookup for a falling edge ramp reset signal, and
  a falling edge update circuit coupled to the phase interpolator circuit module and being configured to
    generate an old clock out falling edge according to an old phase interpolator code input and a falling edge ramp signal of the phase interpolator circuit module, and to
    generate a second update pulse signal in response to the first update pulse signal and a rising edge ramp reset signal in order to disable the falling edge ramp signal of the phase interpolator circuit module and to activate a lookup for a rising edge ramp reset signal, and generate a second clear signal in response to the falling edge ramp reset signal in order to enable the falling edge ramp signal; and wherein the phase interpolator circuit module is configured to generate a new clock out rising edge according to the new phase interpolator code input and the rising edge ramp signal, generate a new clock out falling edge according to the new phase interpolator code input and the falling edge ramp signal, and output an updated clock out signal according to the new clock out rising edge and the new clock out falling edge according to the new phase interpolator code input.

10. The device of claim 9 wherein four input clock phases of the set of input clock phases consists of a 0 degree phase clock signal, a 90 degree phase clock signal, a 180 degree clock phase signal, and a 270 degree phase clock signal.

11. The device of claim 9 wherein the old phase interpolator code input and the new phase interpolator code input are 17-bit mixed code inputs, wherein the 17-bit mixed code input consists of a 15-bit fine phase code and a 2-bit coarse phase code.

12. The device of claim 11 wherein the 2-bit coarse phase code is provided to the multiplexers of the phase interpolator circuit module.

13. The device of claim 11 wherein the 15-bit fine phase code is provided to each of the rising edge interpolator and the falling edge interpolator of the phase interpolator circuit module.

14. The device of claim 9 wherein the rising edge ramp signal is a periodic signal produced by a rising edge interpolator ramp circuit of the phase interpolator circuit module; and wherein the falling edge ramp signal is a periodic signal produced by a falling edge interpolator ramp circuit of the phase interpolator circuit module.

15. The device of claim 9 wherein each of the rising edge interpolator and the falling edge interpolator comprises a first plurality of digital-to-analog converters (DACs) and a second plurality of DACs;

wherein the rising edge ramp signal is determined by a ratio of activated DACs of the first plurality of DACs to the second plurality of DACs in the rising edge interpolator; and wherein the falling edge ramp signal are determined by a ratio of activated DACs of the first plurality of DACs to the second plurality of DACs in the falling edge interpolator.

16. The device of claim 15 wherein each of the plurality of DACs comprises 30 DACs, and wherein a number of activated DACS between the first plurality of DACs and the second plurality of DACs for each of the rising edge and falling edge interpolators is 30.

17. The device of claim 9 wherein the updated clock out signal is output according to the new phase interpolator code input is substantially free from signal glitches due to sequence of generated signals from the phase update circuit module.

18. A data buffer device comprising:
a phase interpolator circuit module comprising:

a rising edge multiplexer configured with a set of input clock phases including four input clock phases nominally spaced apart by 90 degrees and a phase interpolator code input, a rising edge interpolator coupled to the rising edge multiplexer and being configured to the phase interpolator code input, a falling edge multiplexer configured with the set of input clock phases and the phase interpolator code input, a falling edge interpolator coupled to the falling edge multiplexer and being configured to the phase interpolator code input, and an SR latch coupled to the rising edge and falling edge interpolators;

a synchronizer coupled to the phase update circuit module, the synchronizer being configured to provide a synchronizer update signal;

a phase update circuit module coupled to the phase interpolator circuit module being configured to update a rising edge interpolator and a falling edge interpolator of the phase interpolator circuit module according to the phase interpolator code input, the phase update circuit module comprising a rising edge update circuit coupled to the phase interpolator circuit module and being configured to generate a first update pulse signal to disable a rising edge ramp circuit of the phase interpolator circuit module, and generate a first clear signal in response to a rising edge ramp reset signal in order to enable the rising edge ramp signal and to activate a lookup for a falling edge ramp reset signal, and a falling edge update circuit coupled to the phase interpolator circuit module and being configured to generate an old clock out falling edge according to an old phase interpolator code input and a falling edge ramp signal of the phase interpolator circuit module, and to generate a second update pulse signal in response to the first update pulse signal and a rising edge ramp reset signal in order to disable the falling edge ramp signal of the phase interpolator circuit module and to activate a lookup for a rising edge ramp reset signal, and generate a second clear signal in response to the falling edge ramp reset signal in order to enable the falling edge ramp signal; and wherein the phase interpolator circuit module is configured to output an updated clock out signal according to a new clock out rising edge and a new clock out falling edge according to the new phase interpolator code input.

19. The device of claim 18 wherein the old phase interpolator code input and the new phase interpolator code input are 17-bit mixed code inputs, wherein the 17-bit mixed code input consists of a 15-bit fine phase code and a 2-bit coarse phase code; wherein the 2-bit coarse phase code is provided to the multiplexers of the phase interpolator circuit module; and wherein the 15-bit fine phase code is provided to each of the rising edge interpolator and the falling edge interpolator of the phase interpolator circuit module.

20. The device of claim 18 wherein each of the rising edge interpolator and the falling edge interpolator comprises a first plurality of digital-to-analog converters (DACs) and a second plurality of DACs;

wherein the rising edge ramp signal is determined by a ratio of activated DACs of the first plurality of DACs to the second plurality of DACs in the rising edge interpolator; and wherein the falling edge ramp signal are determined by a ratio of activated DACs of the first plurality of DACs to the second plurality of DACs in the falling edge interpolator.

* * * * *